US006774892B2

(12) United States Patent
Tamura et al.

(10) Patent No.: US 6,774,892 B2
(45) Date of Patent: Aug. 10, 2004

(54) DISPLAY DRIVER IC

(75) Inventors: Tsuyoshi Tamura, Nagano-ken (JP); Noboru Itomi, Nerasake (JP)

(73) Assignee: Seiko Epson Corporation, Tokyo (JP)

(*) Notice: Subject to any disclaimer, the term of this patent is extended or adjusted under 35 U.S.C. 154(b) by 278 days.

(21) Appl. No.: 09/954,338

(22) Filed: Sep. 11, 2001

(65) Prior Publication Data

US 2002/0096679 A1 Jul. 25, 2002

(30) Foreign Application Priority Data

Sep. 13, 2000 (JP) ........................................ 2000-277812

(51) Int. Cl.[7] ................................................ G09G 5/00
(52) U.S. Cl. ..................... 345/204; 345/98; 365/189.01
(58) Field of Search ................................ 345/204, 205, 345/98, 100, 571, 572, 573, 574, 536; 365/220, 210, 230.01, 230.03, 230.04, 230.05, 230.06, 189.01, 189.02, 189.03, 189.05

(56) References Cited

U.S. PATENT DOCUMENTS

| | | | | | |
|---|---|---|---|---|---|
| 5,016,214 A | * | 5/1991 | Laymoun | .................... | 365/154 |
| 5,329,490 A | * | 7/1994 | Murotani | .................... | 365/222 |
| 5,420,600 A | * | 5/1995 | Strobel et al. | ................. | 345/51 |
| 5,701,270 A | * | 12/1997 | Mohan Rao | ........... | 365/230.03 |
| 5,726,677 A | * | 3/1998 | Imamura | ..................... | 345/99 |
| 5,815,136 A | * | 9/1998 | Ikeda et al. | ................... | 345/98 |
| 6,052,327 A | * | 4/2000 | Reddy et al. | .......... | 365/230.05 |
| 6,078,542 A | | 6/2000 | Tomishima | | |
| 6,377,492 B1 | * | 4/2002 | Rong et al. | ............ | 365/189.02 |
| 6,418,063 B1 | * | 7/2002 | Seitsinger et al. | ..... | 365/189.05 |
| 6,519,200 B2 | * | 2/2003 | Mizugaki | .................... | 365/222 |
| 2002/0033810 A1 | * | 3/2002 | Matsuyama | ................. | 345/204 |
| 2002/0057265 A1 | * | 5/2002 | Tamura et al. | .............. | 345/204 |

FOREIGN PATENT DOCUMENTS

| | | |
|---|---|---|
| JP | 63-26897 | 2/1988 |
| JP | 63-183692 | 7/1988 |
| JP | 1-300496 | 12/1989 |
| JP | 5-166366 | 7/1993 |
| JP | 7-326186 | 12/1995 |
| JP | 9-265780 | 10/1997 |
| JP | 9-265781 | 10/1997 |
| JP | 10-092180 | 4/1998 |
| JP | 11-260060 | 9/1999 |
| JP | 2000-011639 | 1/2000 |
| JP | 2000-021175 | 1/2000 |
| JP | 2001-076489 | 3/2001 |

* cited by examiner

Primary Examiner—Xiao Wu
(74) Attorney, Agent, or Firm—Michael T. Gabrik

(57) ABSTRACT

A display driver IC with a built-in RAM that can restrain an increase in its power consumption even when the total number of memories in the column direction increases. Such a display driver IC has a main read line that is commonly used by memory cells in the same column arranged along a column direction and transmits display data that is read from successively selected memory cells. The memory cells are divided at a specified number thereof in the column direction to form blocks. Each of the column-blocks is provided with a sub-read line, and display data read from one of the memory cells in each of the blocks is transferred through the corresponding sub-read line. A main switch is provided to selectively connect a corresponding one of the sub-read lines to the main read line. Each of the memory cells is provided with a sub-switch that selectively connects to a corresponding sub-read line.

11 Claims, 7 Drawing Sheets

DISPLAY DRIVER IC

BACKGROUND OF THE INVENTION

1. Field of the Invention

The present invention relates to a display driver IC that drives a display section such as a liquid crystal display panel, and more particularly to a display driver IC having a built-in RAM having display read ports.

2. Description of the Related Art

In a driver having a built-in RAM, data read lines for driving a display section such as a liquid crystal display panel are provided independently of bit line pairs for reading or writing data between the driver and an MPU.

FIG. 7 shows a display read line OLCD that is commonly connected to a plurality of memory cells M11 to Mn1 that are arranged column-wise. Although omitted in FIG. 7, the memory cells M11 to Mn1 are provided with switches (for example, P-type MOS transistors) that are connected to the display read line OLCD. One end of the display read line OLCD is connected to an N-type MOS transistor Tr for pre-charging the display read line OLCD to, for example, a LOW potential before reading data.

With further miniaturization of semiconductor processes achieved in recent years, RAMs having a greater memory capacity can be manufactured. Accordingly, the number n of memory cells n disposed in the column direction shown in FIG. 7 can be increased. With more memory cells, the total length of the display read line OLCD becomes longer, such that its parasitic resistance and parasitic capacity increase. Also, the number of memory cells (more particularly the P-type MOS transistors described above) that are connected to the display read line OLCD increases, which becomes a capacitive load.

When the load of the display read line increases, the pre-charge transistor Tr requires a higher drive current, the power consumption during a pre-charge operation increases, and the pre-charge time also increases. On the other hand, when display data is read out, the large sized pre-charge transistor becomes a load, and therefore the drive current of an output driver that is connected to the display read line OLCD must also be increased. As a result, with an increased memory capacity, the power consumed by the RAMs increases. In this regard, a larger memory capacity implemented in a display driver IC, which is used in portable equipment that needs re-charging such as a mobile phone, can cause a problem.

OBJECTS OF THE INVENTION

In view of the above, it is an object of the present invention to provide a display driver IC that overcomes the above-described problems.

It is another object of this invention to provide a display driver IC that can restrain an increase in the power consumption when its memory is provided with a greater capacity.

SUMMARY OF THE INVENTION

In accordance with one embodiment of the present invention, a display driver IC comprises: a plurality of memory cells arranged in a column direction and divided into a plurality of blocks, each block containing a specified number of memory cells; a plurality of display word lines that successively select the plurality of memory cells in the column direction; a main read line commonly shared by the plurality of memory cells, which transfers display data read from each one of the memory cells that are successively selected by the plurality of display word lines; a plurality of sub-read lines, one for each column-block of memory cells for transferring display data read from each one of the memory cells in that column-block; a plurality of main switches, one for each column-block for selectively connecting a corresponding one of the sub-read lines to the main read line; and a plurality of sub-switches, one for each of the plurality of memory cells, and selected by a respective one of the display word lines to thereby connect that memory cell to a corresponding one of the sub-read lines.

In the display driver IC of the present invention, the load connected to one main read line is composed of one of the main switches, one of the sub-read lines that is connected to the corresponding main switch, and a plurality of sub-switches that connect to the corresponding sub-read line, such that the load is not dependent on the total number of the memory cells in the column direction. Accordingly, even if the total number of memory cells in the column direction increases as a result of increased memory capacity, the load on the main read line is substantially reduced compared to a conventional structure.

In the present invention, the read path also needs to be pre-charged before a data reading operation. For this, a corresponding pre-charge device may be connected to each of the sub-read lines, or a pre-charge device may be connected to the main read line. Furthermore, the driver may include a pre-charge device for each sub-read line and main read line.

The plurality of display word lines may include a plurality of main word lines, one for each block, for selectively turning on a corresponding one of the main switches. In this case, each of the main word lines may be activated by an upper bit signal of an address signal.

The plurality of display word lines may also include a plurality of sub-word lines in each column-block for selecting a corresponding one of the memory cells in that column-block. In this case, each of the sub-word lines may be activated by a lower bit signal of the address signal.

Each pre-charge device may preferably pre-charge both the main read line and the corresponding one of the sub-word lines during a period in which one of the main switches is turned on and before a period in which one of the sub-switches is turned on. In this way, all of the data read paths could be pre-charged.

The effects and advantages of the present invention are more fully realized when the total number of the plurality of memory cells is 280 or greater. In contrast, when the total number of memories in a conventional structure reach that number, the increase in power consumption makes it difficult to realize a portable apparatus.

| Description of Reference Identifiers | |
|---|---|
| 10 | Flip-flop |
| 12, 14 | Inverter |
| 20, 22, 24, 26, 28, 29 | Transistor |
| M11, M12, . . . Mnm | Memory cell |
| BM, /BM | Bit line pair |
| BS, /BS | Bit line pair |
| WL11, WL21, . . . WLn1 | First word line |
| WL12, WL22, . . . WLn2 | Second word line |
| MR | Main read line |
| SR1 to SR35 | Sub-read line |
| B1 to B35 | Block |
| MSW1 to MSW35 | Main switch |
| SSW1 to SSW35 | Sub-switch |
| Tr1 to Tr35, TrMR | Pre-charge transistor |
| OLCD | Display read line |

DESCRIPTION OF THE PREFERRED EMBODIMENTS

Figure 1:
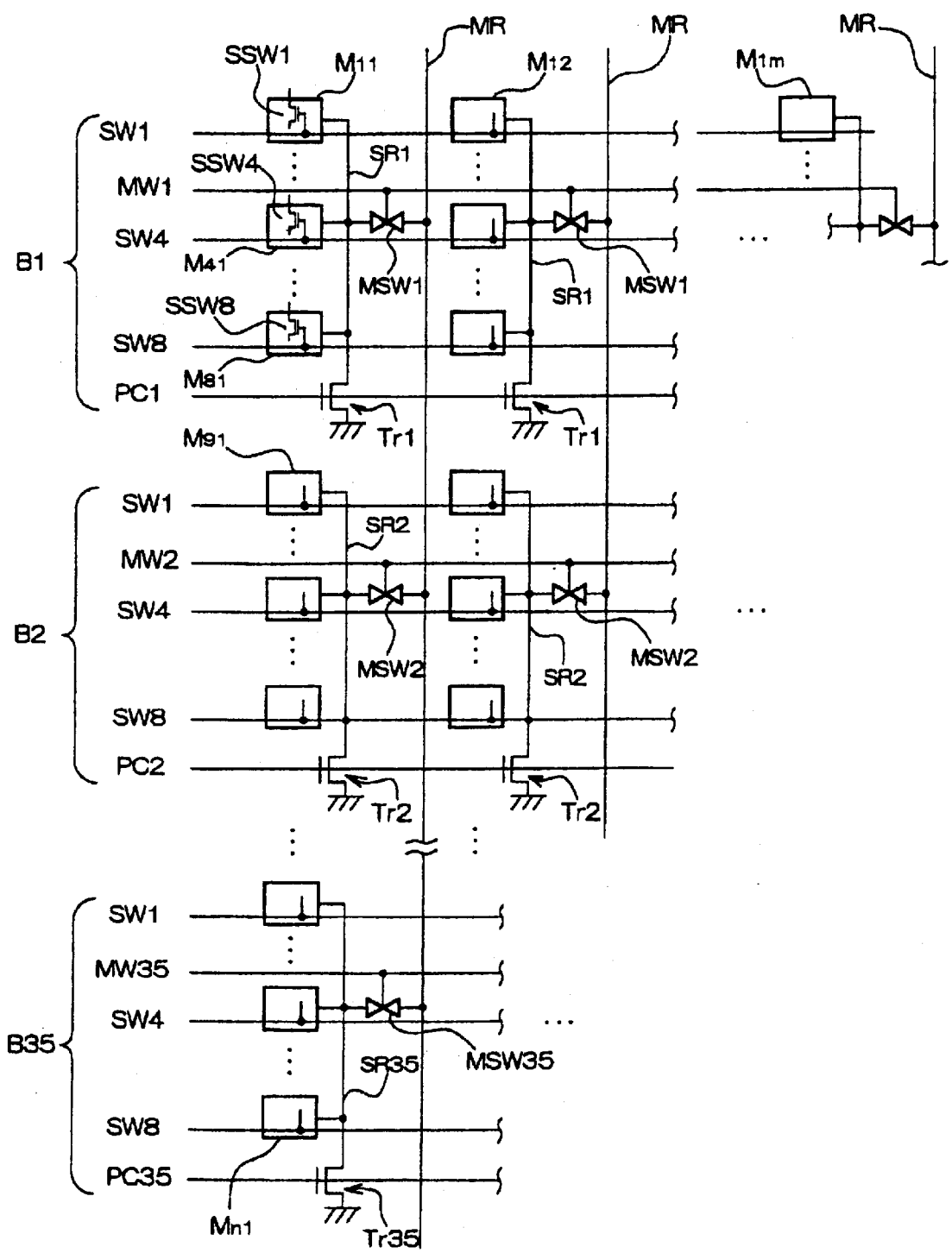
FIG. 1 is a schematic plan view of a RAM region that is mounted in a display driver IC in accordance with one embodiment of the present invention, and mainly shows the structure of the data read system for the display drive.

Embodiments of the present invention are described with reference to the accompanying drawings. FIG. 1 schematically shows a RAM region that is included in a display driver IC. It is noted that a display driver IC to which the present invention is applied can also include, in addition to the RAM shown in FIG. 1, an interface with an external MPU, an MPU system control circuit that controls the RAM according to commands from the MPU, an LCD system control circuit that controls the RAM for a display, such as, for example, a liquid crystal display, and a driver section that converts data read out from the RAM to voltages suitable for driving display elements, such as, for example, liquid crystal elements.

General Structure of RAM

Referring to FIG. 1, the display driver IC includes a RAM having a total of m×n units of memory cells M11 to Mmn in which m units thereof are arranged in a row direction and n units thereof are arranged in a column direction. In the present embodiment, n=280; therefore, there are 280 memory cells in each column. In this embodiment, each column of 280 memory cells (e.g., M11–Mn1) is divided into, for example, 35 blocks B1 to B35 so that each block comprises eight memory cells.

FIG. 1 mainly shows a structure that reads data out onto a display section such as a liquid crystal display section, in which a main read line MR is disposed along the column direction for each of the columns. In each column, sub-read lines SR1 to SR35 are provided for the blocks B1 to B35, respectively. In each column, sub-read lines SR1 to SR35 are connected to a corresponding main read line MR through corresponding main switches MSW1 to MSW35, respectively, as shown in FIG. 1.

The main switches MSW1 to MSW35 are selectively turned on and off by corresponding display main word lines MW1 to MW35. Display sub-word lines SW1 to SW8 are disposed in each of the blocks B1 to B35 to controllably connect any one of the eight memory cells to one of the respective sub-read lines SRi to SR35. Pre-charge transistors Tr1 to Tr35 are connected between the respective sub-read lines SR1 to SR35 and a pre-charge power supply such as a ground. Each pre-charge transistor Tr1 to Tr35 is turned on and off by potentials on its corresponding pre-charge signal line PC1 to PC35.

Description of Memory Cell

Figure 2:
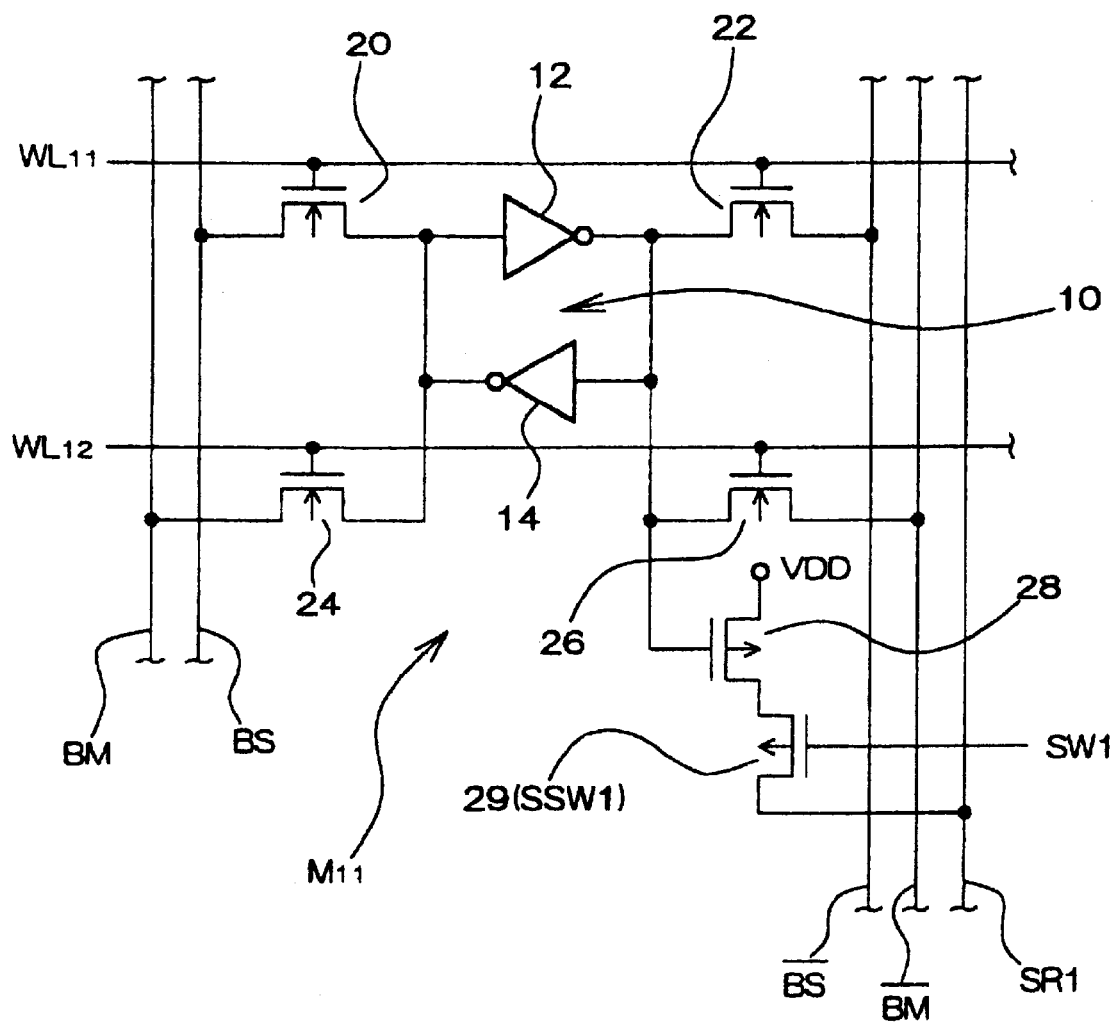
FIG. 2 is a circuit diagram of a memory cell of the RAM shown in FIG. 1.

Each of the memory cells M11 to Mmn has the same structure. One of them, memory cell M11, is shown in FIG. 2. Referring to FIG. 2, memory cell M11 includes a flip-flop 10 that is formed by connecting two inverters 12 and 14 in a loop. The flip-flop 10 is connected to a bit line pair BS and $\overline{BS}$ and a bit line pair BM and $\overline{BM}$ through first to fourth transistors 20, 22, 24 and 26 that are formed from, for example, N-type MOS transistors that are driven by first and second word lines WL11 and WL12.

The first and second word lines WL11 and WL12 are commonly used by the memory cells M11, M12, . . . M1m in the first row. Each of the other rows of memory cells also has a corresponding pair of first and second word lines. The first word lines are identified as WL11, WL21, . . . WLn1, and the second word lines as WL12, WL22, . . . WLn2, respectively. By selecting one line among the first word lines WL11, WL21, . . . WLn1, memory cells in one row can be selected. By selecting one line among the second word lines WL12, WL22, . . . WLn2, asynchronously of the aforementioned selection operation, memory cells in another row can be selected. When the first word line WL11 is selected, the first and second transistors 20 and 22 turn on, such that the flip-flop 10 is connected to the bit line pair BS and $\overline{BS}$. As a result, data from the MPU can be written to the memory cell M11 through the bit line pair BS and $\overline{BS}$.

In the three-port RAM shown in FIG. 1, during a period in which the memory cell M11 is being selected, another memory cell in the same column including the memory cell M11 can be selected. For example, by selecting the second word line WL22 in the second row, the flip-flop 10 in the memory cell M21 is connected to the bit line pair BM and $\overline{BM}$. In this manner, data is read from the memory cell M21 and output to the MPU through the bit line pair BM and $\overline{BM}$.

It is noted that the bit line pair BM and $\overline{BM}$ can be exclusively used for data reading, and the bit line pair BS and $\overline{BS}$ can be exclusively used for data writing, or they can be set vice versa. However, without being limited to these examples, both of the bit line pairs BM and $\overline{BM}$ and BS and $\overline{BS}$ may be used for both data writing and data reading.

Structure to Read Display Data

In the triple-port RAM described above, in order to successively select the memory cells in each column in the column direction to read display data onto a display section, the display main word lines MW1 to MW35 described above are provided, and furthermore, display sub-word lines SW1 to SW8 are further provided in each of the blocks B1 to B35. Here, before data is read through the main read line MR, the main read line MR and a selected one of the sub-read lines are pre-charged to a specified potential. In the present embodiment, the pre-charge transistors Tr1 to Tr35 shown in FIG. 1 are used to pre-charge them to a LOW potential. Each pre-charge transistor in a particular column and block is connected to a corresponding sub-read line, as shown in FIG. 1. However, one pre-charge transistor may be provided for each main read line MR instead.

Transistors 28 and 29 that are, for example, P-type MOS transistors, are provided to supply data at HIGH to the sub- and main read lines that are pre-charged to LOW depending on a retained potential at the flip-flop 10. The transistors 28 and 29 are serially connected between a supply line of the power supply potential VDD and the sub-read line SR (SR1 in FIG. 2). The gate of transistor 28 is connected to an output line of inverter 12, and the gate of transistor 29 is connected to a display sub-word line SW1.

Therefore, when the potential on the display sub-word line SW1 becomes LOW such that the memory cell M11 is selected for display, the transistor 29 turns on. In this instance, if the output of the inverter 12 is LOW, the transistor 28 also turns on, and the sub-read line SR1 that has been pre-charged to LOW is charged to the VDD potential such that HIGH is read out. Conversely, if the output of the inverter 12 is HIGH, the transistor 28 turns off, and the sub-read line SR1 that has been pre-charged to LOW does not change its potential, such that LOW is read out.

The transistor 29 is called a sub-switch, as opposed to the main switches MSW1 to MSW35 shown in FIG. 1. Sub-switches SSW1 to SSW8 for each of the eight rows of memory cells in each of the blocks B1 to B35, as shown in FIG. 1.

Operation to Read Out Display Data

Figure 3:
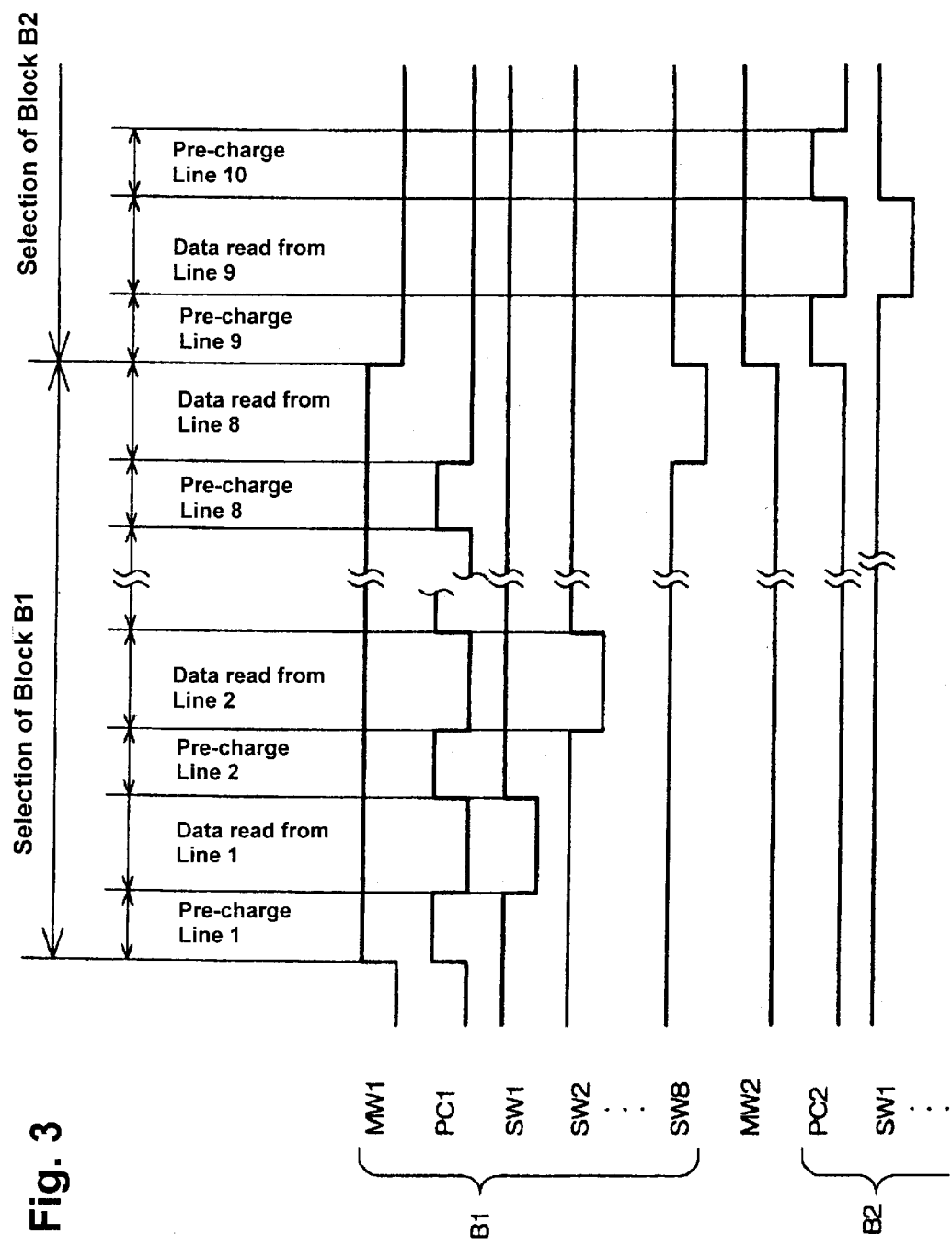
FIG. 3 is a timing diagram describing the reading operation of the RAM shown in FIG. 1.

In a reading operation for display, rows of memory cells are successively selected in the column direction, such that data for each line on the display section is successively read out from the RAM. This operation is described with reference to FIG. 3.

First, the potential on the display main word line MW1 is set to HIGH to select the block B1. The potential on the display main word line MW1 rises from LOW to HIGH based on an upper bit that is common to address signals for designating memory cells in the first line to the eighth line. As a result, all of the main switches MSW1 in the block B1 turn on, such that the main read lines MR are connected to the corresponding sub-read lines SRI in the block B1.

During the period in which the block B1 is being selected, display data is read out from the memory cells, one after another, located in block B1 column-by-column. In reading data from the memory cells located in each of the lines, the plural display sub-word lines SW1 to SW8 are activated one-by-one (set to LOW active in the present embodiment) by a lower bit signal among the address signals described above. By this operation, the plural sub-switches SSW1 to SSW8 (the transistors 29 shown in FIG. 2) are successively turned on one-by-one. As a result, as described above, data in the memory cells are read out through the corresponding sub-read lines SR and the main read lines MR.

Prior to reading out the display data, the read lines need to be pre-charged. In this connection, a pre-charge signal line PC1 for driving all of the pre-charge transistors Tr1 in block B1 is activated (set to HIGH active) in the period in which the main switch MSW1 is turned on (in the period in which block B1 is being selected), and before each period in which each of the sub-switches SSW1 to SSW8 is turned on one-by-one (see FIG. 3).

During each of the pre-charge periods, both of the main read line MR and the corresponding sub-read line SR1 are pre-charged. Thereafter, the operation described above with respect to block B1 is repeated for each of the other blocks B2 to B35 each time that block is selected.

Effects of Reducing Power Consumption

In the present embodiment, when a particular block is selected, each display main read line MR connects only to one of the main switches MSW1 to MSW35, one of the display sub-read lines SR1 to SR35, the eight sub-switches SSW1 to SSW8 that are connected to that display sub-read line and the pre-charge transistor Tr1. This would be the same even as the total number n of the memory cells in the column direction is increased, except for a longer wiring length. In contrast, the display read line OLCD shown in FIG. 7 connects to the total number n of P-type MOS transistors in the total number n of the memory cells and the pre-charge transistor Tr, namely. Thus, in the arrangement of FIG. 7, the number of loads increases as n increases. Therefore, although the display main read line MR of the present embodiment has a greater total length (longer by sub-read lines connected thereto), its load capacitance is substantially reduced compared to the display read line OLCD shown in FIG. 7.

Figure 7:
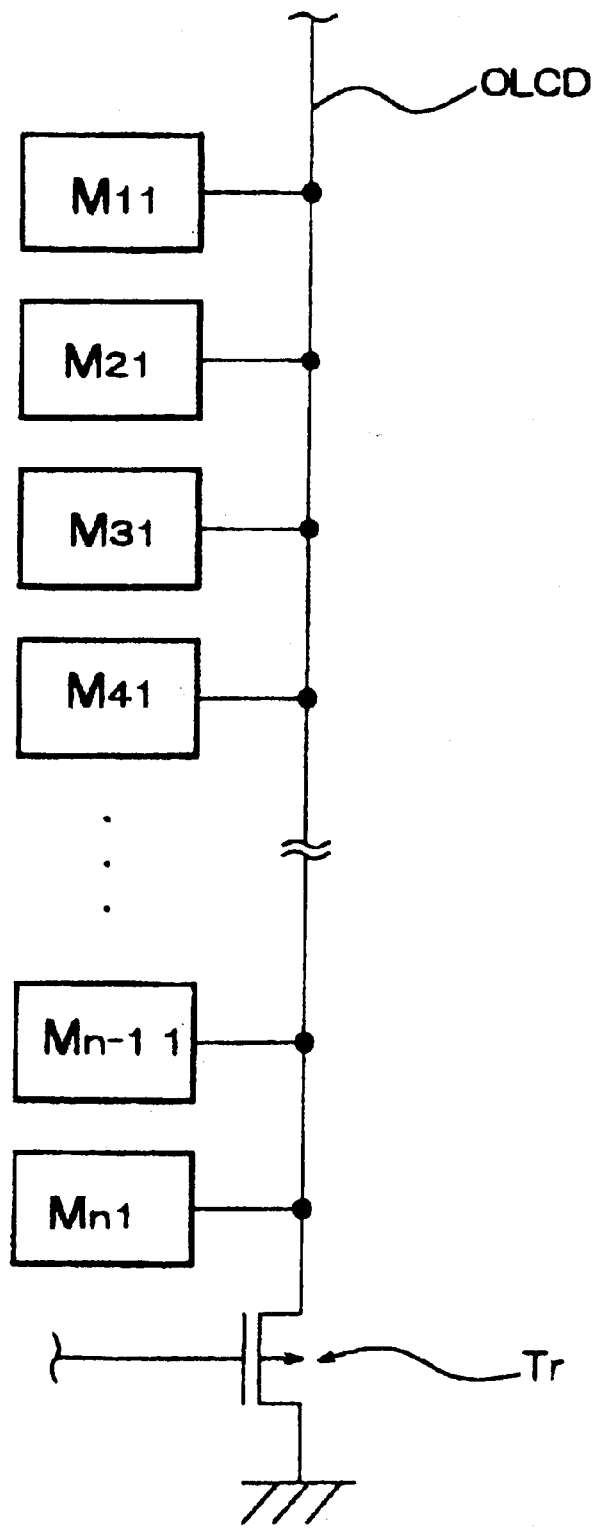
FIG. 7 is a schematic diagram showing the connection of memory cells in a column direction and display read lines in accordance with conventional technology.

For the reasons described above, the pre-charge transistor of the present embodiment can be a transistor having a smaller current drivability and a smaller size than the conventional pre-charge transistor shown in FIG. 7. Also, for the reasons described above, the load capacitance of the display main read line MR of the present embodiment becomes smaller, its pre-charge time becomes shorter, and its power consumption at the time of pre-charging is reduced. Furthermore, an output driver that is to be connected to the display main read line MR can have a low current drivability, such that the power consumption is also reduced.

Description of Modified Example

Figure 4:
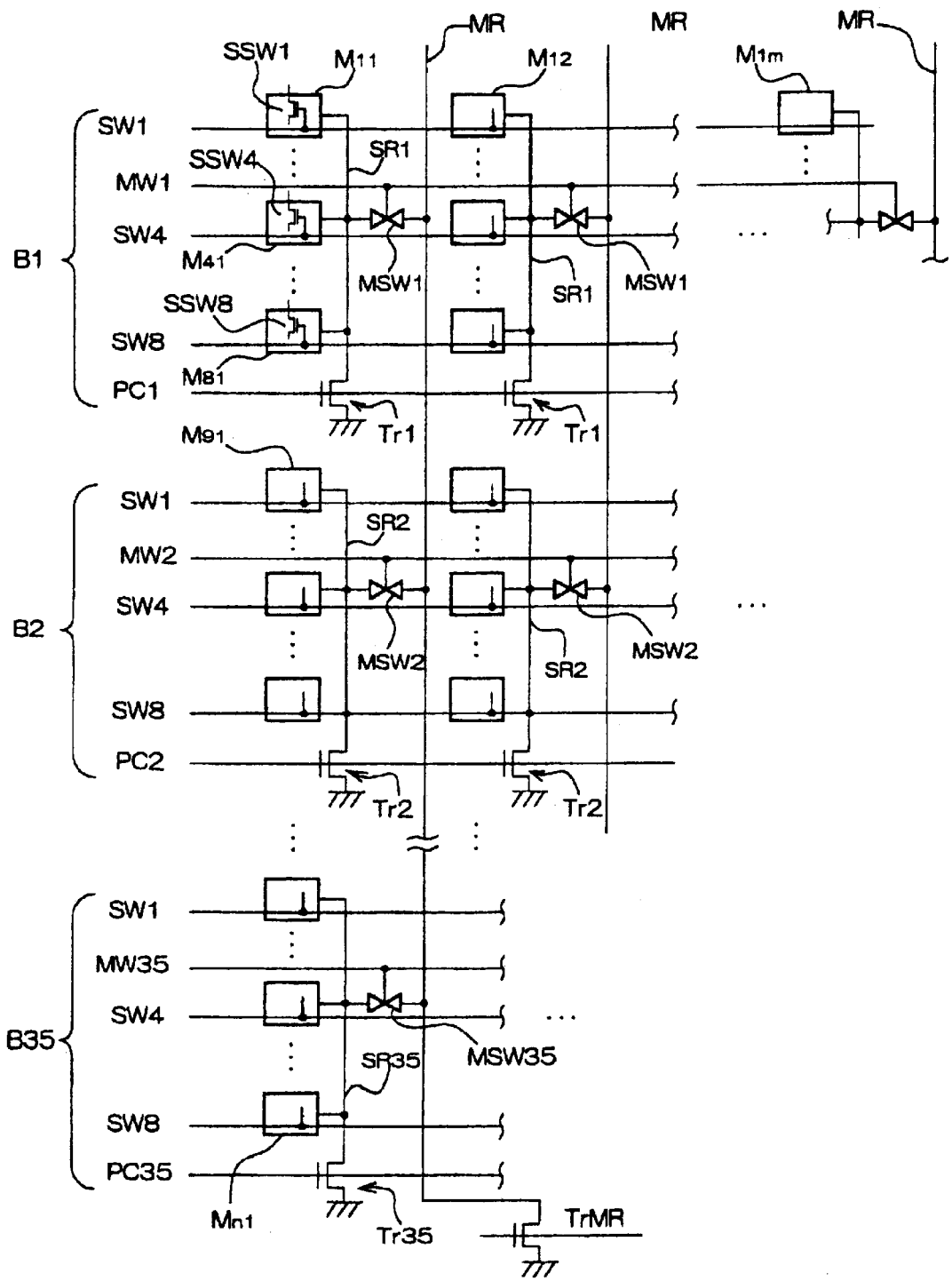
FIG. 4 shows a modified version of the RAM shown in FIG. 1 in accordance with another embodiment of the present invention.

FIG. 4 shows a modified example in which a pre-charge transistor TrMR is connected to one end of each of the main read lines MR.

A pre-charge signal line PC is commonly connected to gates of the plural pre-charge transistors TrMR. The same signal as the one supplied to the pre-charge line PC1 is supplied to the pre-charge signal line PC, when, for example, the block B1 is selected. In other words, the same signal as the one supplied to a pre-charge line PCn is supplied to the pre-charge signal line PC, when block Bn (where n is an integer from 1 to 35 representing the selected block number) is selected.

Figure 5:
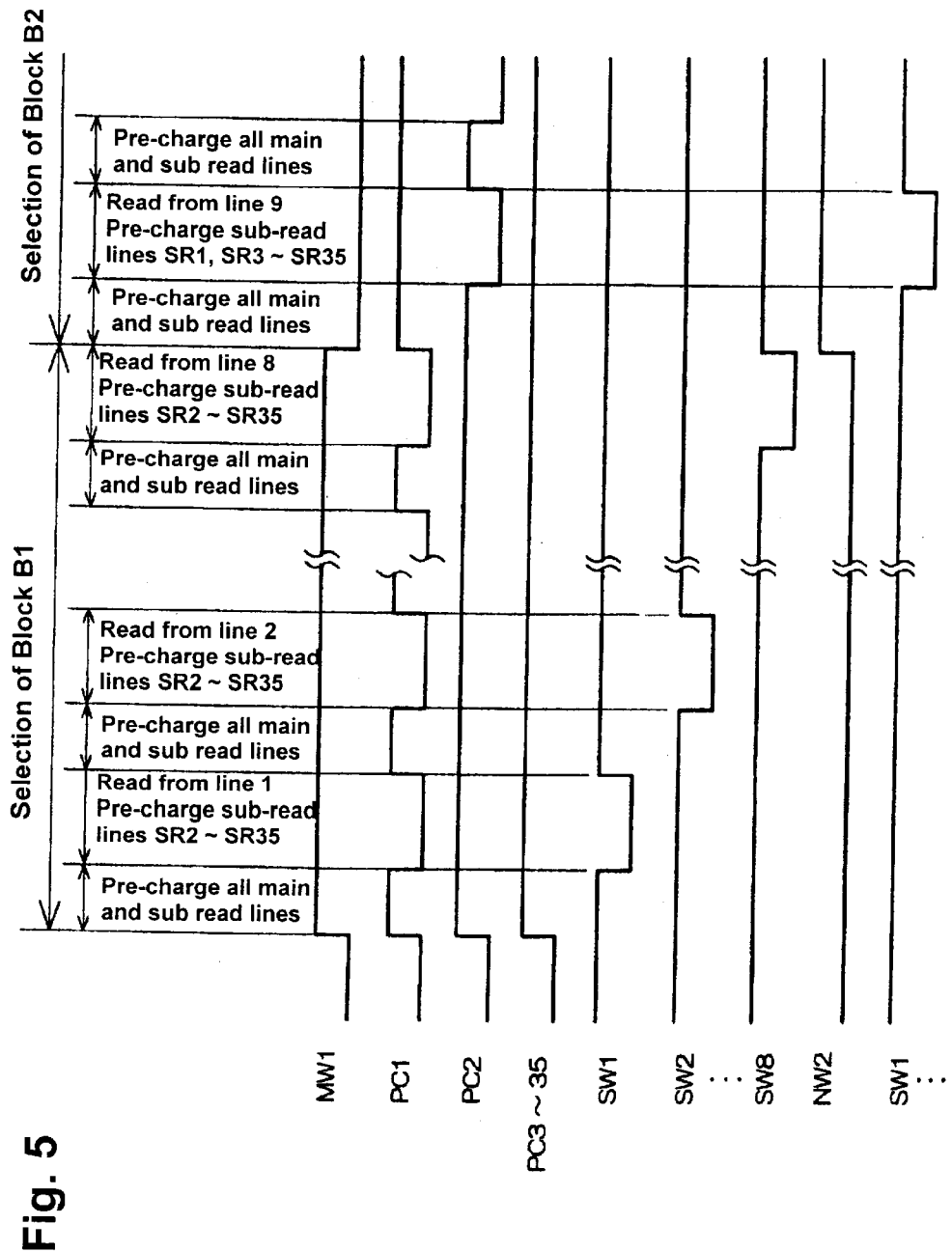
FIG. 5 is a driving waveform diagram describing the pre-charge and data reading operations in the memory shown in FIG. 4.

FIG. 5 shows operation waveforms in an operation to read data from a memory having the structure shown in FIG. 4. FIG. 5 only shows the case when the block B1 and the block B2 are successively selected. As shown in FIG. 5, in a pre-charge period before reading out data from each of the lines, all of the pre-charge transistors Tr1 to Tr35 and the TrMR turn on, such that all of the main read lines MR and all of the sub-read lines SR1 to SR35 are pre-charged.

When data is read, the sub-read lines in the selected block and only the main read lines MR that are all used for the data reading are relieved from the pre-charge state, and the other sub-read lines remain to be pre-charged. Therefore, while the block B1 is being selected, HIGH is input in the pre-charge lines PC2 to PC35, and the sub-read lines SR1 to SR35 remain to be pre-charged. However, once the pre-charge potential is reached, the charge does not move, and therefore the power consumption does not increase.

Figure 6:
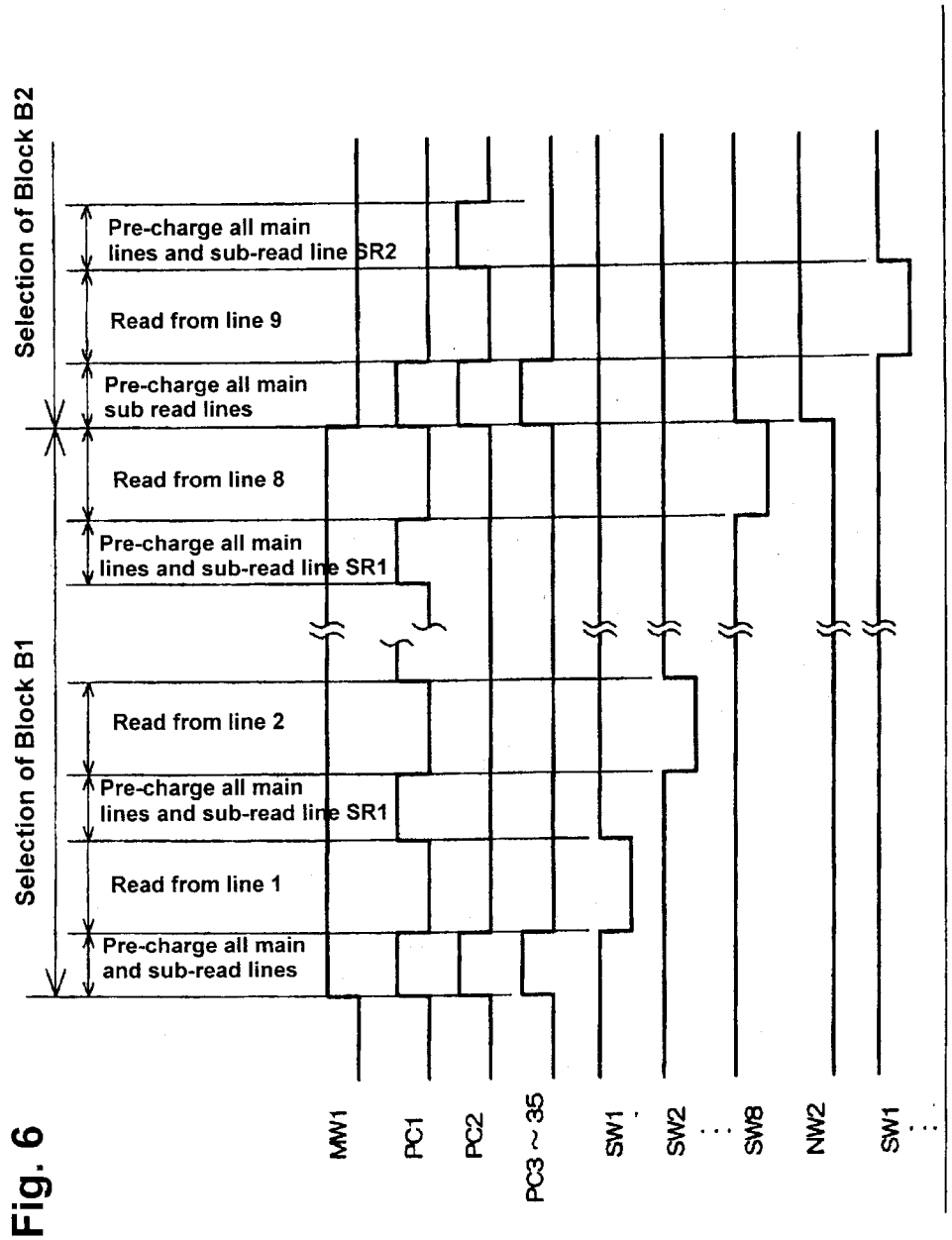
FIG. 6 shows an alternative waveform diagram describing the pre-charge and data reading operations in the memory shown in FIG. 4.

Instead of the one shown in FIG. 5, a pre-charge method may be conducted in a manner shown in FIG. 6. All of the main and sub read lines MR, and SR1 to SR35 are pre-charged only in an initial pre-charge period when a block is selected. When data is read out later, a pre-charge operation is not conducted for the sub-read lines in the blocks other than the selected block. The potential on the sub-read lines in the non-selected blocks does not change after the pre-charge, and thus pre-charging is not required. After data is read out, the sub-read lines in the selected block and only the main read lines that are all used for reading are pre-charged. In this manner, the pre-charge operation substantially similar to the one shown in FIG. 5 can be performed.

While the invention has been described in conjunction with several specific embodiments, many further alternatives, modifications, variations and applications will be apparent to those skilled in the art that in light of the foregoing description. Thus, the invention described herein is not limited to the described embodiments but rather is intended to embrace all such alternatives, modifications, variations and applications as may fall within the spirit and scope of the appended claims.

What is claimed is:

1. A display driver IC, comprising:
   a plurality of memory cells arranged in a column direction and divided into a plurality of blocks, each block containing a specified number of memory cells;
   a plurality of display word lines that successively select the plurality of memory cells in the column direction;
   a main read line commonly shared by the plurality of memory cells, which transfers display data read from each one of the memory cells that are successively selected by the plurality of display word lines;
   a plurality of sub-read lines, one for each column-block of memory cells for transferring display data read from each one of the memory cells in that column-block;
   a plurality of main switches, one for each column-block for selectively connecting a corresponding one of the sub-read lines to the main read line; and
   a plurality of sub-switches, one for each of the plurality of memory cells, and selected by a respective one of the display word lines to thereby connect that memory cell to a corresponding one of the sub-read lines.

2. A display driver IC according to claim 1, further comprising a plurality of pre-charge devices, one connected to each of the sub-read lines, for pre-charging a read path prior to a reading operation.

3. A display driver IC according to claim 1, further comprising a pre-charge device connected to the main read line for pre-charging a read path prior to a reading operation.

4. A display driver IC according to claim 2, further comprising an additional pre-charge device connected to the main read line for pre-charging a read path prior to a reading operation.

5. A display driver IC according to claim 1, wherein the plurality of display word lines include:
   a plurality of main word lines, one for each block, for selectively turning on a corresponding one of the main switches; and
   a plurality of sub-word lines in each column-block for selecting a corresponding one of the memory cells in that column-block.

6. A display driver IC according to claim 5, wherein each of the main word lines is activated by an upper bit signal of an address signal to thereby turn on a corresponding one of the main switches.

7. A display driver IC according to claim 6, wherein each of the sub-word lines is activated by a lower bit signal of the address signal to thereby turn on a corresponding one of the sub-switches.

8. A display driver IC according to claim 3, wherein each pre-charge device pre-charges both of the main read line and the corresponding one of the sub-word lines during a period in which one of the main switches is turned on and before a period in which one of the sub-switches is turned on.

9. A display driver IC according to claim 1, wherein the total number of the plurality of memory cells is 280 or greater.

10. A display unit, comprising:
    a display device; and
    the display driver IC as defined by claim 1.

11. An electrical device, comprising:
    the display unit as defined by claim 10.

* * * * *